United States Patent
Yamaguchi

(10) Patent No.: US 11,535,513 B2
(45) Date of Patent: Dec. 27, 2022

(54) METHOD OF MANUFACTURING PHYSICAL QUANTITY DETECTION SENSOR, AND PHYSICAL QUANTITY DETECTION SENSOR

(71) Applicant: Mitsubishi Electric Corporation, Tokyo (JP)

(72) Inventor: Yasuo Yamaguchi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 775 days.

(21) Appl. No.: 16/456,405

(22) Filed: Jun. 28, 2019

(65) Prior Publication Data

US 2020/0079647 A1    Mar. 12, 2020

(30) Foreign Application Priority Data

Sep. 6, 2018   (JP) .............................. JP2018-167284

(51) Int. Cl.
*B81C 1/00* (2006.01)
*G01P 15/08* (2006.01)
*G01P 15/125* (2006.01)

(52) U.S. Cl.
CPC ...... *B81C 1/00888* (2013.01); *G01P 15/0802* (2013.01); *G01P 15/125* (2013.01)

(58) Field of Classification Search
CPC combination set(s) only.
See application file for complete search history.

(56) References Cited

U.S. PATENT DOCUMENTS 5,243,861 A   9/1993 Kloeck et al.
5,418,681 A   5/1995 Thomas et al.
(Continued)

FOREIGN PATENT DOCUMENTS

DE   11 2011 105 884 T5   8/2014
JP         H05-326702 A   12/1993
(Continued)

OTHER PUBLICATIONS

An Office Action; "Notice of Reasons for Refusal", mailed by the Japanese Patent Office dated Sep. 21, 2021, which corresponds to Japanese Patent Application No. 2018-167284 and is related to U.S. Appl. No. 16/456,405; with English language translation.
(Continued)

*Primary Examiner* — Niki H Nguyen
(74) *Attorney, Agent, or Firm* — Studebaker & Brackett PC

(57) ABSTRACT

A method of manufacturing a physical quantity detection sensor includes forming a stacked structure having a plurality of sensor devices by bonding together a sensor substrate and a different type substrate of a different material from a material of the sensor substrate, the sensor substrate having a plurality of sensor movable portions therein, and dicing the stacked structure using a dicing blade, wherein a groove is provided in one of the sensor substrate and the different type substrate to penetrate the one of the sensor substrate and the different type substrate, the groove having a width larger than a width of the dicing blade, and in at least part of the dicing, the dicing blade is accommodated in the groove and advances without contacting surfaces on left and right sides of the groove.

19 Claims, 7 Drawing Sheets

(56) References Cited

U.S. PATENT DOCUMENTS

| | | | |
|---|---|---|---|
| 2008/0211043 A1* | 9/2008 | Chen | H01L 27/14687 438/51 |
| 2008/0233714 A1 | 9/2008 | Kojima | |
| 2012/0193731 A1 | 8/2012 | Foster | |
| 2014/0260612 A1 | 9/2014 | Aono et al. | |

FOREIGN PATENT DOCUMENTS

| | | | |
|---|---|---|---|
| JP | 2007-165789 A | 6/2007 |
| JP | 2010-272627 A | 12/2010 |
| JP | 2012-160733 A | 8/2012 |

OTHER PUBLICATIONS

An Office Action issued by the German Patent Office dated Mar. 9, 2022, which corresponds to German Patent Application No. 10 2019 212 650.2 and is related to U.S. Appl. No. 16/456,405 with English language translation.

* cited by examiner

METHOD OF MANUFACTURING PHYSICAL QUANTITY DETECTION SENSOR, AND PHYSICAL QUANTITY DETECTION SENSOR

BACKGROUND

Field

The present invention relates to a method of manufacturing a physical quantity detection sensor and a physical quantity detection sensor.

Background Art

Japanese Unexamined Patent Application Publication No. 2012-160733 discloses that glass cover layers are joined to a machined silicon layer, so that the glass cover layers provide an airtight seal of an active device. Specifically, sensor devices in the silicon machined layer are held and sandwiched between the first and second glass layers and make up a wafer. Further, Japanese Unexamined Patent Application Publication No. 2012-160733 discloses that the wafer is sliced to be divided into a plurality of individual sensor units.

There is a technique for manufacturing physical quantity sensors in which in a wafer processing step, at least one substrate and a substrate having physical quantity detection sensors are bonded to each other, and the bonded structure is diced into chips of a physical quantity detection sensor. In many cases, factors for manufacturing a dicing blade such as a material, shape and rotation speed are specified to dice a substrate of a specific material. Consequently, when dicing a stacked structure in which substrates of different types of materials are bonded together, although a substrate can be diced without any problem, many chippings and cracks may be generated in another substrate when compared with a case where the other substrate is cut by a blade specific to the other substrate. Chipping tends to be generated on an upper surface of a substrate, a bottom surface of the substrate, or in corner portions where dicing target portions intersect. When thermal stress resulting from dicing or wire bonding or a load from a mold is exerted on a chipping or a crack generated as described above, a crack propagates from the chipping portion, leading to a problem in that a physical quantity detection sensor does not function properly.

SUMMARY

The present invention has been made to solve the problem described above, and an object of the present invention is to provide a method of manufacturing a physical quantity detection sensor configured to suppress the generation of chipping or crack in dicing and a physical quantity detection sensor.

In some examples, a method of manufacturing a physical quantity detection sensor includes forming a stacked structure having a plurality of sensor devices by bonding together a sensor substrate and a different type substrate of a different material from a material of the sensor substrate, the sensor substrate having a plurality of sensor movable portions therein, and dicing the stacked structure using a dicing blade, wherein a groove is provided in one of the sensor substrate and the different type substrate to penetrate the one of the sensor substrate and the different type substrate, the groove having a width larger than a width of the dicing blade, and in at least part of the dicing, the dicing blade is accommodated in the groove and advances without contacting surfaces on left and right sides of the groove.

In some examples, a physical quantity detection sensor includes a sensor substrate including a sensor movable portion, and a different type substrate bonded on the sensor substrate, the different type substrate being formed of a different material from a material of the sensor substrate, wherein part of an outer edge of one of the sensor substrate and the different type substrate recedes further inwards than an outer edge of the other of the sensor substrate and the different type substrate.

Other and further objects, features and advantages of the invention will appear more fully from the following description.

DETAILED DESCRIPTION

A method of manufacturing a physical quantity detection sensor and a physical quantity detection sensor according to embodiments will be described by reference to drawings. The physical quantity detection sensor may be referred to simply as a sensor. The same reference signs will be given to the same or corresponding constituent elements, so that the repetition of descriptions may be omitted. In embodiments which will be described below, although specific examples will be described, the present disclosure is not limited to those examples and hence can be modified in various ways.

First Embodiment

Figure 1:
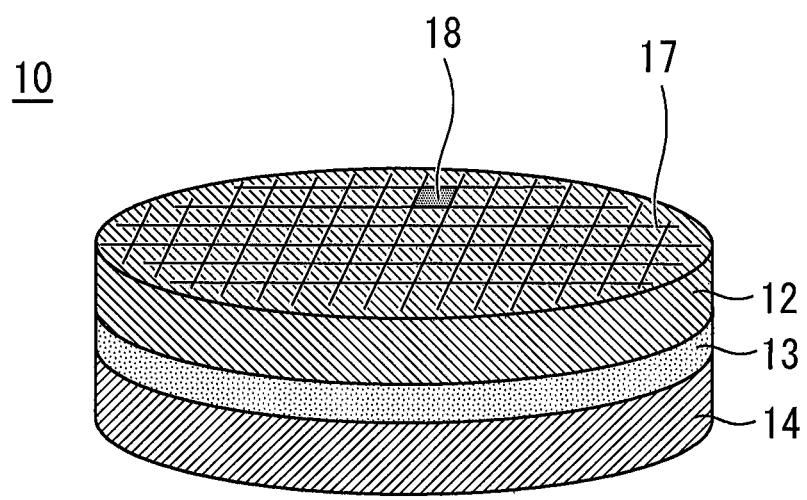
FIG. 1 is a perspective view illustrating a stacked structure.

In a sensor manufacturing method according to a first embodiment, firstly, a stacked structure is formed by bonding a plurality of substrates together. FIG. 1 is a perspective view illustrating a configuration example of a stacked structure 10. This stacked structure 10 is formed by bonding, to the sensor substrate 13, a first different type substrate 12 which differs in material from a sensor substrate 13 and a second different type substrate 14 which differs in material from the sensor substrate 13. For example, a resin adhesive can be used in bonding the substrates together.

The sensor substrate 13 is a single substrate in which a plurality of sensor movable portions is provided. A material of the sensor substrate 13 is, for example, a semiconductor. For example, a plurality of acceleration sensor portions is formed in the sensor substrate 13. The first different type substrate 12 bonded on an upper surface of the sensor substrate 13 and the second different type substrate 14 bonded on a lower surface of the sensor substrate 13 are formed, for example, of glass. A plurality of sensor devices is formed in the stacked structure 10. In other words, a plurality of acceleration sensor chips 18, which are formed by a semiconductor processing technology and which are not yet divided, is disposed in the stacked structure 10.

Figure 2:
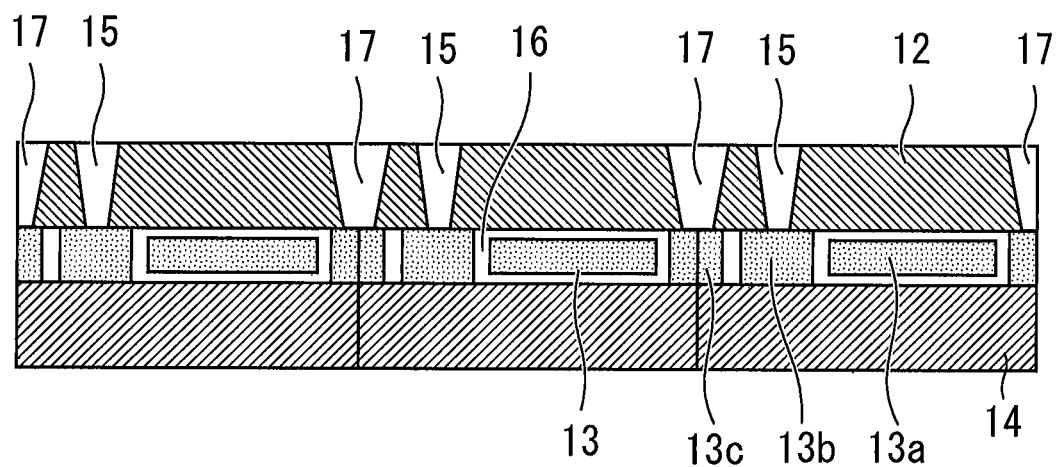
FIG. 2 is a partially sectional view of the stacked structure.

FIG. 2 is a partially sectional view of the stacked structure 10 illustrated in FIG. 1. FIG. 2 illustrates three chips which are contained in the stacked structure and which are not yet divided. The sensor substrate 13 includes sensor movable portions 13a, sensor electrodes 13b, and frame portions 13c of the acceleration sensors. The sensor movable portion 13a is provided in a void 16 so that the sensor movable portion 13a can be displaced by acceleration of the sensor. This void 16 is sealed airtight by the frame portion 13c, the first different type substrate 12, and the second different type substrate 14.

Grooves 17 penetrate the first different type substrate 12 and exposes the sensor substrate 13. These grooves 17 expose, for example, the frame portions 13c. A width of the groove 17 narrows as it extends in a depth direction. This gives a tapering shape to lateral sides of the first different type substrate 12. The groove 17 can be formed by, for example, sand blasting or a wet etching using hydrogen fluoride.

An electrode hole 15 is formed in the first different type substrate 12 to expose the sensor electrode 13b. The electrode hole 15 is formed to pick up an electrical signal from the sensor electrode 13b. To pick up an electrical signal, for example, a metallic film is formed on the sensor electrode 13b, and wire bonding can be applied to the metallic film. There is also a method in which the metallic film formed on the sensor electrode 13b or a wire connected to the metallic film is drawn out to an upper surface of the first different type substrate 12, and wire bonding is applied to that drawn out portion on the first different type substrate 12. Known techniques can be adopted for a forming method of the sensor movable portion 13a and its pattern, and an airtight sealing method by the first and second different type substrates 12, 14.

Figure 3:
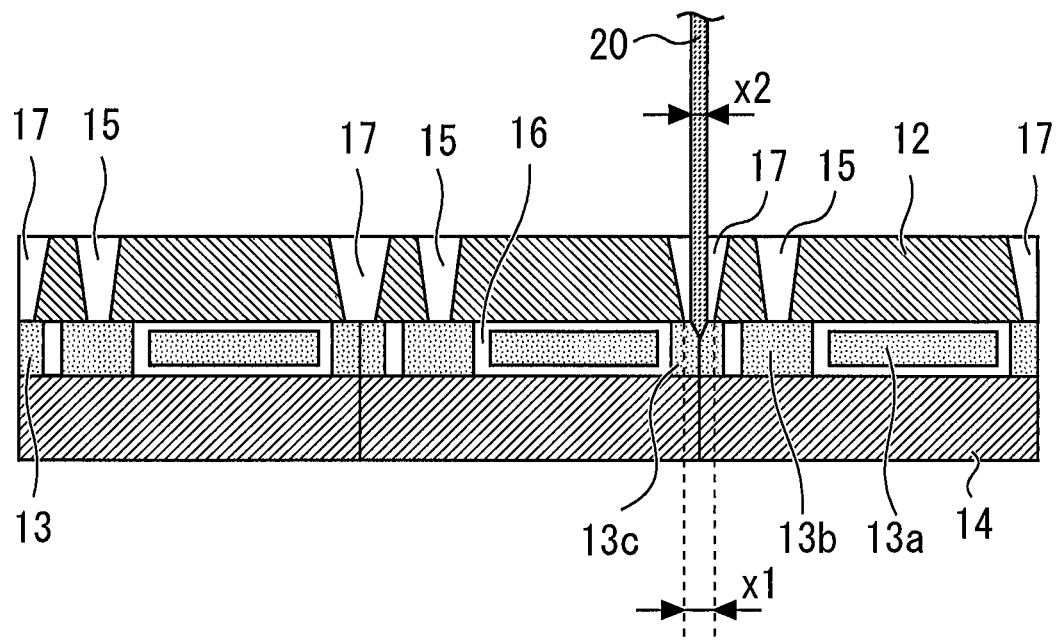
FIG. 3 is a drawing illustrating a dicing of the stacked structure.

After the stacked structure 10 described above is formed, the stacked structure 10 is diced using a dicing blade. FIG. 3 is a drawing illustrating a blade position in dicing. This dicing blade 20 is specified or optimized, for example, for cutting the sensor substrate 13 so that the sensor substrate 13 can be cut without calling for a drawback such as chipping. In the case where the sensor substrate 13 is formed of silicon, a dicing blade and a dicing condition which are used in a normal IC process can be made use of.

A minimum width X1 of the groove 17 is greater than a width X2 of the dicing blade 20. Thus, the dicing blade 20 does not have to cut the first different type substrate 12 at a portion where the groove 17 exists. At the portion where the groove 17 exists, the dicing blade 20 is accommodated in the groove 17, and the dicing blade 20 continues dicing without contacting surfaces on left and right sides of the groove 17.

A plurality of acceleration sensor chips can be cut out by dicing the stacked structure 10 along predetermined dicing lines.

Since the dicing blade 20 does not contact the first different type substrate 12 at the portion where the groove 17 exists, the generation of chipping or crack on the first different type substrate 12 can be suppressed. Since the dicing blade 20 is specified or optimized for cutting the sensor substrate 13, the generation of chipping or crack can be suppressed in cutting the sensor substrate 13. In this embodiment, the second different type substrate 14 is cut by the dicing blade 20 on condition that the generation of chipping or crack due to the cutting of the second different type substrate 14 is slight or permissible.

In this way, in dicing the stacked structure 10 according to the first embodiment, since the dicing blade 20 does not contact the first different type substrate 12 at the portion where the groove 17 exists, the generation of chipping or crack can be suppressed in the dicing step. Since the generation of chipping or crack is suppressed, a risk can be avoided in which when thermal stress resulting from die bonding or wire bonding or a load from the mold is exerted on a chipping or a crack, which would otherwise be generated after dicing, the chipping develops into a crack or the crack develops further. This can avoid the deterioration or failure of the sensor, whereby the function of the sensor can be ensured.

Figure 4:
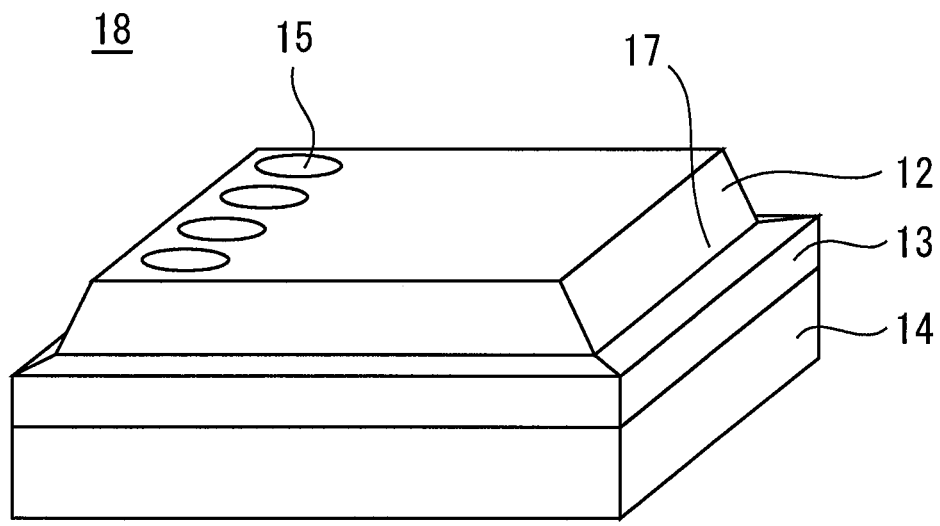
FIG. 4 is a perspective view of a sensor chip.
Figure 5:
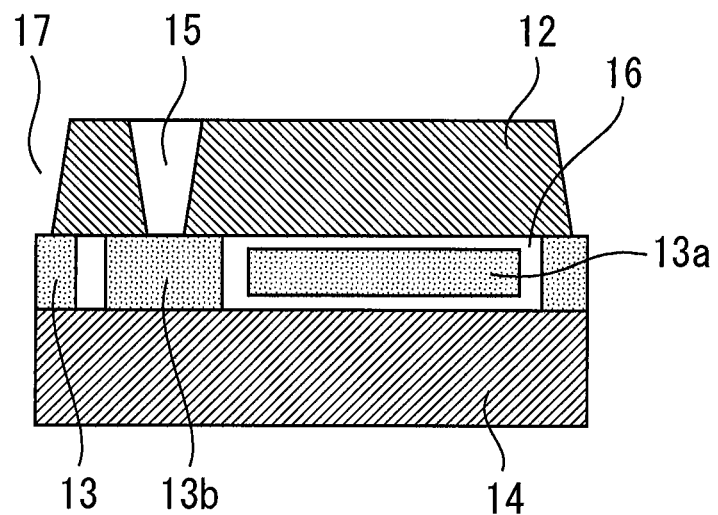
FIG. 5 is a sectional view of the sensor chip.

FIG. 4 is a perspective view illustrating a configuration example of an acceleration sensor chip 18 after dicing. Four lateral surfaces of the first different type substrate 12 are inclined so as to taper the first different type substrate 12 upwards. Since a groove 17 is formed to surround a full circumference of an outer edge of the first different type substrate 12, the outer edge of the first different type substrate 12 recedes further inwards than an outer edge of the sensor substrate 13. In other words, an area of the first different type substrate 12 is smaller than an area of the sensor substrate 13 when seen from above. Consequently, an outer circumferential edge portion of an upper surface of the sensor substrate 13 is not covered by the first different type substrate 12 and is left exposed to the outside. FIG. 5 is a sectional view of the acceleration sensor chip illustrated in FIG. 4. FIG. 5 illustrates the acceleration sensor chip which is designed to suppress the generation of a chipping or a crack. In the case where there are fears that a chipping or a crack is generated, a non-effective area, which surrounds a pattern constituting the sensor and which does not contribute to the operation of the sensor, needs to be ensured so wide that the operation of the sensor is not affected by the chipping or the crack generated. The non-effective area means an outer edge portion of the acceleration sensor chip 18 illustrated for example in FIG. 4. On the contrary to this, in the sensor according to the first embodiment, since the generation of a chipping or a crack can be suppressed, the non-effective area can be reduced. This contributes to a reduction in size of the chip.

In this embodiment, for example, a capacitive acceleration sensor, which constitutes one form of Micro Electro Mechanical System (MEMS) devices having a stacked structure, can be manufactured. However, the technique described above can widely be applied to a method for manufacturing a sensor configured to detect acceleration, angular velocity or other physical quantities.

In the first embodiment, while the first different type substrate 12 and the second different type substrate 14 are provided as different types of substrates of which materials are different from that of the sensor substrate 13, the number of different type substrates may be increased or decreased. A total number of different type substrates can be determined as required according to designs.

In the first embodiment, while the groove 17 is formed to surround the full circumference of the outer edge of the first different type substrate 12, the groove 17 may be formed along a part of the outer edge. For example, the groove 17 can be omitted at or along a portion where the operation of the sensor is affected little even though a chipping or a crack is generated there. In this case, in some part of dicing, the dicing blade 20 is accommodated in the groove 17 and continues dicing without contacting the surfaces on the left and right sides of the groove 17.

Figure 6:
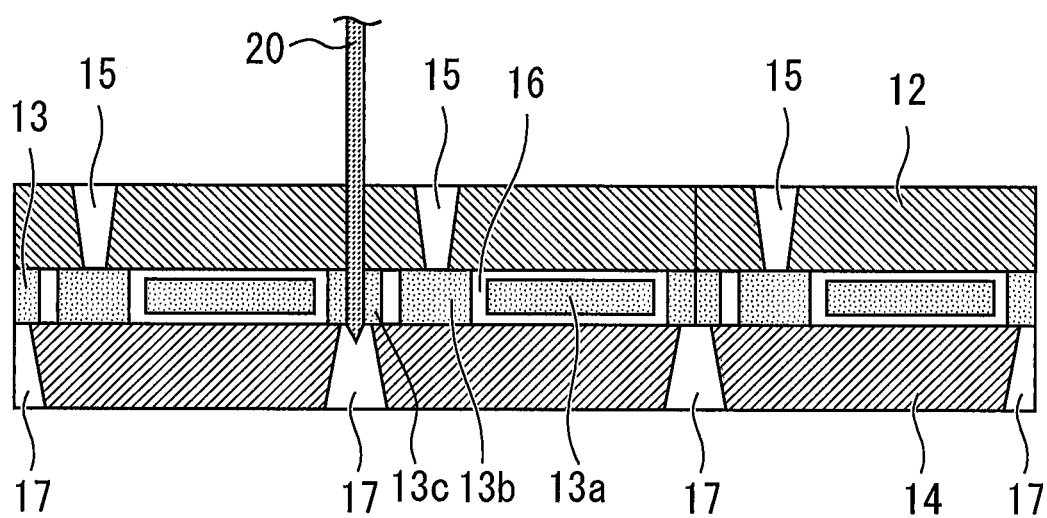
FIG. 6 is a sectional view of the stacked structure according to a modified example.

FIG. 6 is a drawing illustrating a sensor manufacturing method according to a modified example. In FIG. 6, grooves 17 are illustrated as being provided in a second different type substrate 14. In dicing a stacked structure, a dicing blade 20 is accommodated in the groove 17 and continues dicing without contacting surfaces of the second different type substrate 14 which are situated on left and right sides of the groove 17. This form is particularly effective in such a case that more chippings or cracks are generated in dicing the second different type substrate 14 than in dicing a first different type substrate 12.

Figure 7:
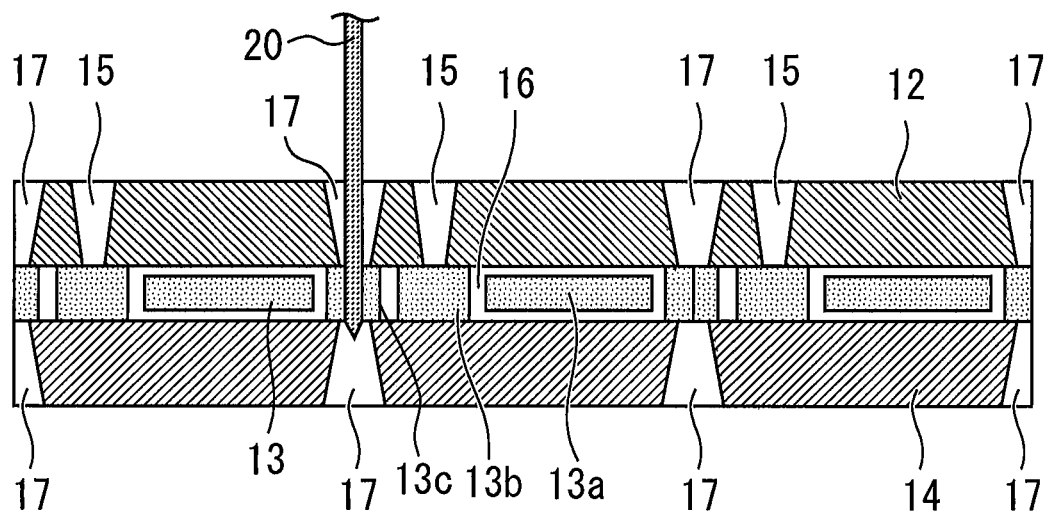
FIG. 7 is a sectional view of the stacked structure according to another modified example.

FIG. 7 is a drawing illustrating a sensor manufacturing method according to another modified example. In FIG. 7, grooves 17 are illustrated as being provided in a first different type substrate 12 and a second different type substrate 14. In this case, a dicing blade 20 is accommodated in the groove 17 in the first different type substrate 12 and the groove 17 in the second different type substrate, 14 and continues dicing without contacting surfaces on left and right sides of the grooves 17. It is only a sensor substrate 13 that is cut by dicing. The generation of a chipping or a crack can be suppressed by executing a dicing specified or optimized for dicing the sensor substrate 13.

These modified examples can be applied to sensor manufacturing methods according to the following embodiments. Since the sensor manufacturing methods according to the following embodiments have many common features to those of the first embodiment, different features from the first embodiment will mainly be described.

Second Embodiment

Figure 8:
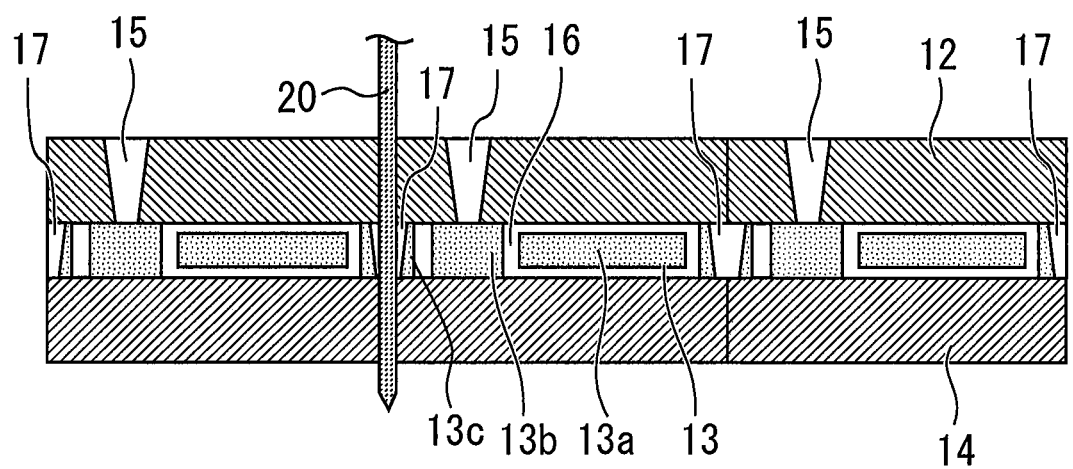
FIG. 8 is a drawing illustrating a sensor manufacturing method according to a second embodiment.

FIG. 8 is a drawing illustrating a sensor manufacturing method according to a second embodiment. Grooves 17 are formed in a sensor substrate 13. The grooves 17 penetrate the sensor substrate 13. A dicing blade 20 is accommodated in the groove 17 and continues dicing the first and second different type substrates 12, 14 without contacting surfaces on left and right sides of the groove 17. In this case, the generation of chipping or crack in the first and second different type substrates 12, 14 can be suppressed by executing a dicing specified or optimized for dicing the first and second different type substrates 12, 14. In the case where the first and second different type substrates 12, 14 are formed of glass, dulling or loading of the blade tends to occur easily when compared with a case where silicon is diced with the blade. For this reason, in dicing the first and second different type substrates 12, 14, a resin bond is used which is easy to be worn appropriately, and the size of an abrasive grain can be increased when compared with a blade for use for dicing silicon. Additionally, in dicing glass, a feed speed of the blade is slowed when compared with dicing silicon.

Figure 9:
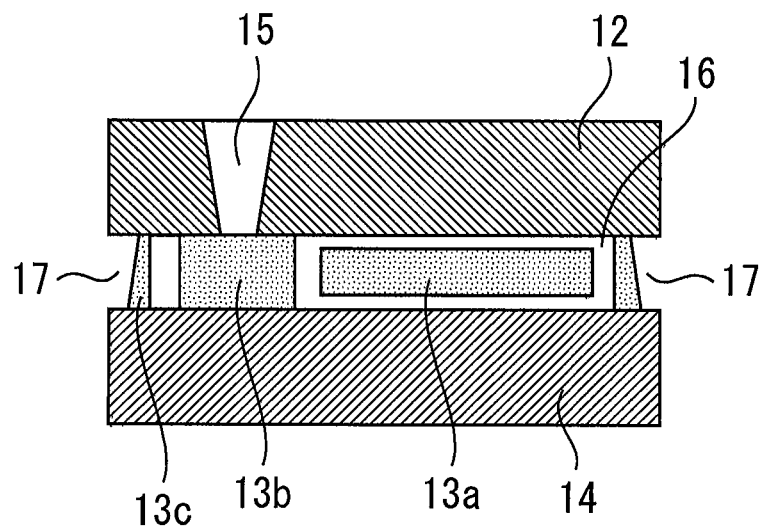
FIG. 9 is a sectional view of the sensor chip.

FIG. 9 is a sectional view of a chip resulting after the dicing. Since the grooves 17 are formed in the sensor substrate 13, an outer edge portion of a lower surface of the first different type substrate 12 and an outer edge portion of an upper surface of the second different type substrate 14 are exposed to the outside.

Figure 10:
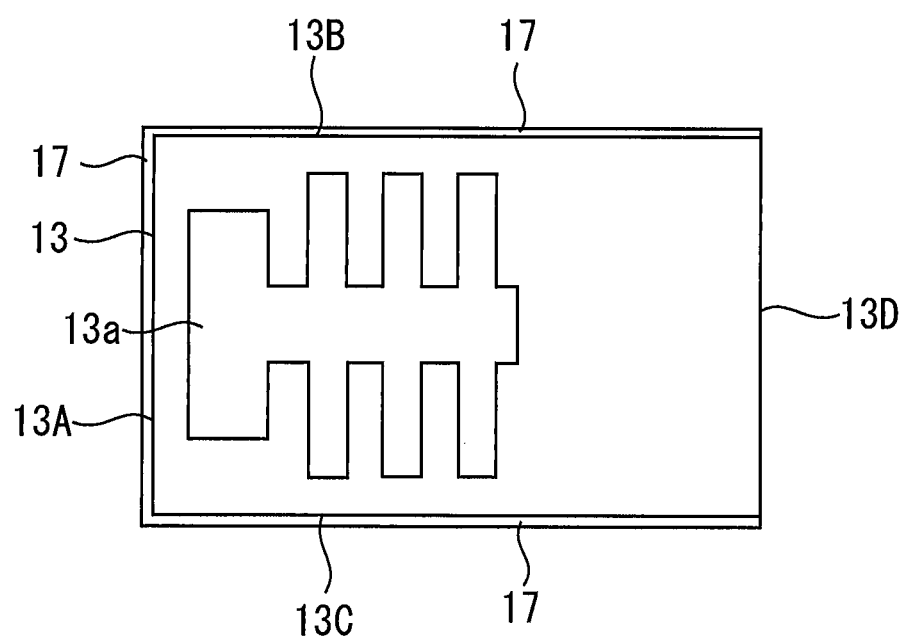
FIG. 10 is a plan view of a sensor movable portion.

FIG. 10 is a plan view illustrating an example of a shape of a sensor movable portion 13a. There are four outer edges 13A, 13B, 13C, 13D surrounding an area of one chip on the sensor substrate 13. The outer edges 13A, 13B, 13C are situated close to the sensor movable portion 13a, while the outer edge 13D is situated away from the sensor movable portion 13a. When taking an effect on the sensor movable portion 13a into consideration, suppressing the generation of chipping or crack on the outer edges 13A, 13B, 13C is needed more than suppressing the generation of chipping or crack on the outer edge 13D. Then, a groove 17 is provided along the outer edges 13A, 13B, 13C, and no groove 17 may be provided along the outer edge 13D.

When viewed from above, providing the groove along only part of the outer edge of the sensor device improves the processing capability of a manufacturing system over the case of providing the groove all along the outer edge of the sensor device. A selection of a portion of the sensor device where the groove 17 is to be omitted can be determined from a viewpoint of in which position of the sensor device the generation of chipping or crack should be suppressed. A groove 17 is formed near a place where the generation of chipping or crack should be suppressed, while a groove 17 can be omitted in a place situated away from the place. In the example illustrated in FIG. 10, the groove 17 is provided along the portions of the outer edge of the sensor device which lie closest to the sensor movable portion 13a.

Third Embodiment

Figure 11:
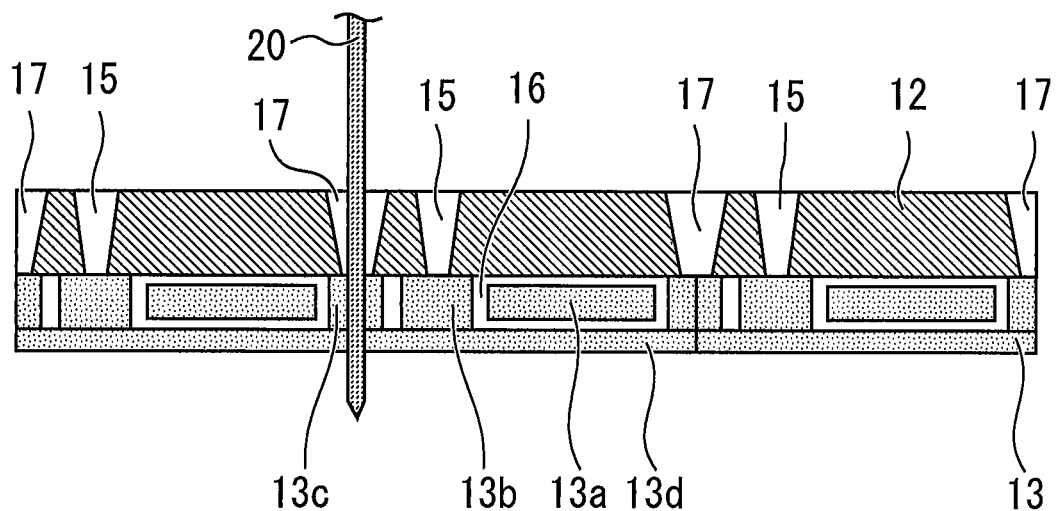
FIG. 11 is a drawing illustrating a sensor manufacturing method according to a third embodiment.

FIG. 11 is a drawing illustrating a sensor manufacturing method according to a third embodiment. A stacked structure includes two substrates. Specifically, the stacked structure is formed by bonding a sensor substrate 13 and a first different type substrate 12 together. For example, a plurality of capacitive acceleration sensors, each being one form of the MEMS device, formed on the stacked structure. The sensor substrate 13 includes a bottom plate portion 13d. A material of the bottom plate portion 13d is, for example, a semiconductor. The bottom plate portion 13d is in contact with lower surfaces of sensor movable portions 13a, sensor electrodes 13b and frame portions 13c. The sensor movable portions 13a are sealed airtight by the bottom plate portion 13d and the first different type substrate 12. In other words, the sensor movable portions 13a are sandwiched by the bottom plate portion 13d and the first different type substrate 12. Grooves 17 are formed in the first different type substrate 12. A dicing blade 20 is accommodated in the groove 17 and continues dicing without contacting surfaces on left and right sides of the groove 17.

In the third embodiment, it is only the first different type substrate 12 where the grooves 17 are provided. A dicing target is limited only to a sensor substrate 13 that is formed of a silicon material or the like by providing the bottom plate portion 13d in place of the second different type substrate 14 described in the first embodiment. Thus, the generation of chipping or crack can be suppressed by executing a dicing specified or optimized for dicing the sensor substrate 13.

Figure 12:
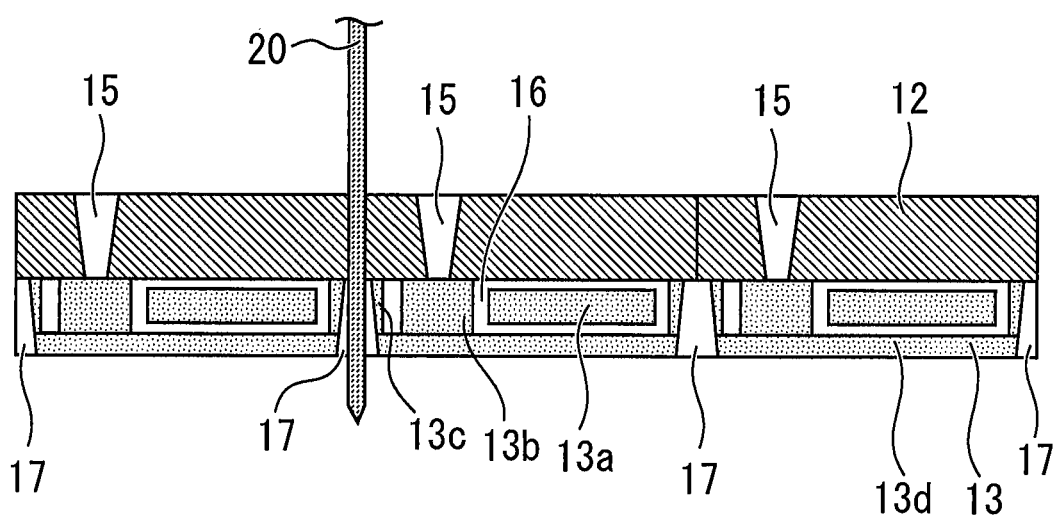
FIG. 12 is a drawing illustrating a sensor manufacturing method according to a modified example.

FIG. 12 is a drawing illustrating a sensor manufacturing method according to a modified example. Grooves 17 are provided in a sensor substrate 13. The grooves 17 penetrate frame portions 13c and bottom plate portion 13d. A dicing blade 20 is accommodated in the groove 17 and continues dicing without contacting surfaces on left and right sides of the groove 17.

Whether the grooves 17 should be provided in the first different type substrate 12 as illustrated in FIG. 11 or in the sensor substrate 13 as illustrated in FIG. 12 can be determined from, for example, a viewpoint of which can suppress more the generation of chipping or crack. For example, a stacked structure with no groove 17 provided is diced to identify a substrate where more chippings or cracks are generated, and grooves can be provided in the identified substrate.

Fourth Embodiment

Figure 13:
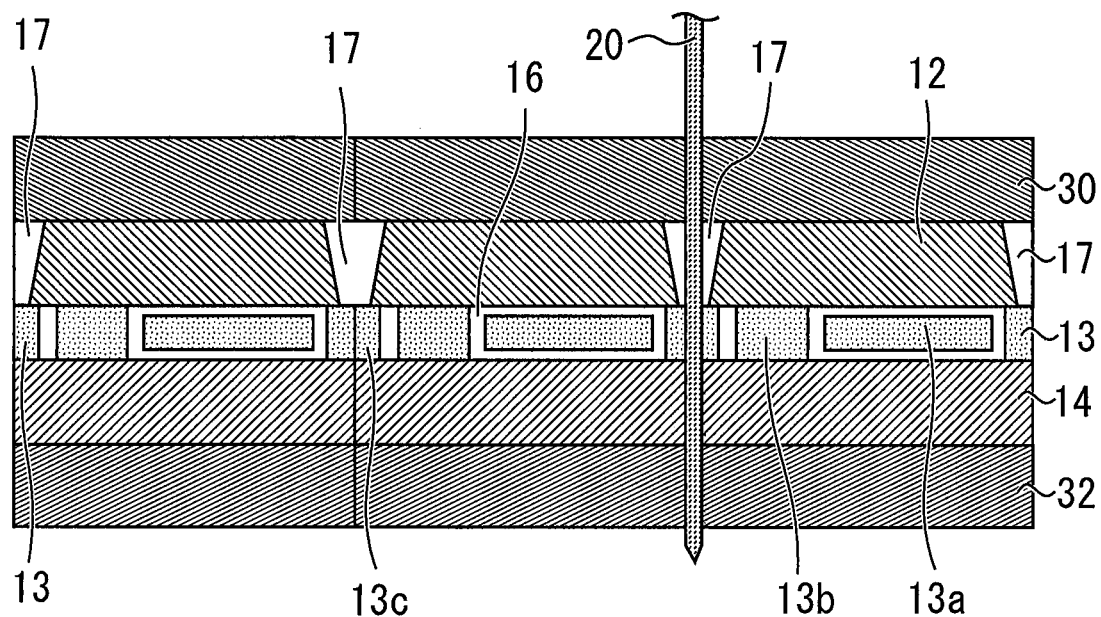
FIG. 13 is a drawing illustrating a sensor manufacturing method according to a fourth embodiment.

FIG. 13 is a drawing illustrating a sensor manufacturing method according to a fourth embodiment. A stacked structure illustrated in FIG. 13 is formed by bonding five substrates together. A third different type substrate 30 is bonded on an upper surface of a first different type substrate 12. A fourth different type substrate 32 is bonded on a lower surface of a second different type substrate 14. Materials of the third different type substrate 30 and the fourth different type substrate 32 can be the same as those of the first and second different type substrates 12, 14, respectively or can be different from those of the first and second different type substrates 12, 14 as well as a sensor substrate 13. The materials of the third different type substrate 30 and the fourth different type substrate 32 are, for example, glass. The third different type substrate 30 and the fourth different type substrate 32 are formed, for example, to enhance the rigidity of resulting sensors.

Grooves 17 are formed in the first different type substrate 12. In dicing, a dicing blade 20 is accommodated in the groove 17 and continues dicing without contacting surfaces on left and right sides of the groove 17. When a plurality of different type substrates is involved, the grooves 17 can be formed in a plurality of substrates in the sensor substrate 13 and the plurality of different type substrates. For example, the grooves 17 can be formed in both the first different type substrate 12 and the third different type substrate 30.

Figure 14:
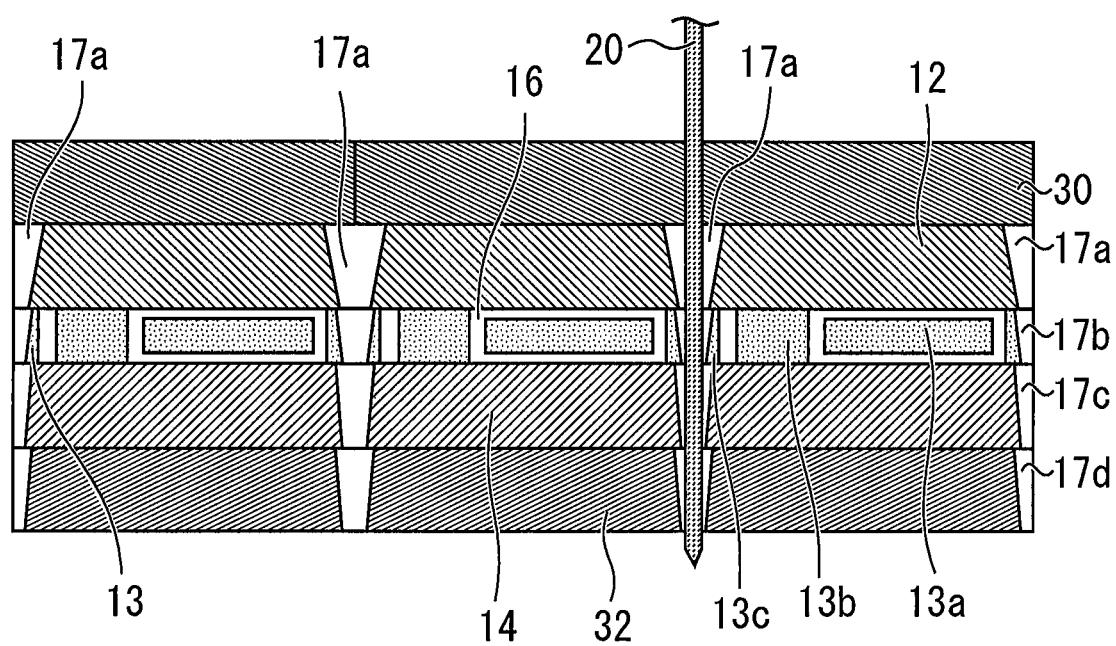
FIG. 14 is a drawing illustrating a sensor manufacturing method according to a modified example.

FIG. 14 is a drawing illustrating a sensor manufacturing method according to a modified example. Grooves 17a are formed in a first different type substrate 12, grooves 17b are formed in a sensor substrate 13, grooves 17c are formed in a second different type substrate 14, and grooves 17d are formed in a fourth different type substrate 32. The grooves 17a, 17b, 17c, 17d formed in the first different type substrate 12, the sensor substrate 13, the second different type substrate 14 and the fourth different type substrate 32, respectively, communicate with one another. The grooves 17a, 17b, 17c, 17d provide one continuously communicating through hole as a whole. In this stacked structure, dicing can be continuously advanced only by cutting a third different type substrate 30 with a dicing blade 20. FIG. 14 illustrates the dicing blade 20 as being accommodated in the four grooves 17a, 17b, 17c, 17d and continuing dicing without contacting surfaces on left and right sides of the grooves 17a, 17b, 17c, 17d. In this case, the generation of chipping or crack can be suppressed by executing dicing which is specified or optimized for dicing the third different type substrate 30.

Grooves can be provided in a substrate or substrates generating more chippings by selecting a substrate or substrates to be diced according to the specification of a dicing blade 20 used or based on the results of the previous dicing. The number of different type substrates can be increased or reduced as required. Examples of the materials of the different type substrates described above include glass and ceramics. A dicing condition for ceramics is equal to the dicing condition for glass. In a sensor substrate and a plurality of different type substrates, grooves are formed in all the substrates excluding one substrate, whereby the dicing target substrate can be minimized. For example, when different types of materials such as glass and silicon need to be diced at the same time, a dicing may be executed which is optimized for a layer of a large volume to be cut by dicing, or a dicing may be executed which is specified for a layer where more chippings tend to be generated to prevent the generation of chipping.

According to the some examples described herein, the generation of chipping or crack can be suppressed by forming a groove on the substrate.

The invention claimed is:

1. A method of manufacturing a physical quantity detection sensor, comprising:

forming a stacked structure having a plurality of sensor devices by bonding together a sensor substrate and a different type substrate of a different material from a material of the sensor substrate, the sensor substrate having a plurality of sensor movable portions positioned within a cavity defined in part by sidewalls composed of the sensor substrate and a surface of the different type substrate joining the sidewalls; and dicing the stacked structure using a dicing blade, wherein a groove is provided in one of the sensor substrate and the different type substrate to penetrate the one of the sensor substrate and the different type substrate, the groove having a width larger than a width of the dicing blade, and in at least part of the dicing, the dicing blade is accommodated in the groove and advances without contacting surfaces on left and right sides of the groove.

2. The method of manufacturing a physical quantity detection sensor according to claim 1, wherein the sensor substrate is a semiconductor, and the different type substrate is glass.

3. The method of manufacturing a physical quantity detection sensor according to claim 1, wherein the different type substrate comprises a first different type substrate bonded on an upper surface of the sensor substrate and a second different type substrate bonded on a lower surface of the sensor substrate.

4. The method of manufacturing a physical quantity detection sensor according to claim 3, wherein the groove is provided in the first different type substrate or the second different type substrate.

5. The method of manufacturing a physical quantity detection sensor according to claim 3, wherein the groove is provided in the first different type substrate and the second different type substrate.

6. The method of manufacturing a physical quantity detection sensor according to claim 4, wherein lateral surfaces of the different type substrate are inclined to taper the different type substrate by the groove.

7. The method of manufacturing a physical quantity detection sensor according to claim 1, wherein the groove is provided in the sensor substrate.

8. The method of manufacturing a physical quantity detection sensor according to claim 7, wherein the groove is provided at a portion on an outer edge of the sensor device, the portion lying closest to the sensor movable portion.

9. The method of manufacturing a physical quantity detection sensor according to claim 1, wherein the sensor substrate has a bottom plate portion, and the sensor movable portion is sandwiched by the bottom plate portion and the different type substrate.

10. The method of manufacturing a physical quantity detection sensor according to claim 1, wherein the different type substrate comprises a plurality of different type substrates, and the groove is formed in a plurality of substrates among the sensor substrate and the plurality of the different type substrates.

11. The method of manufacturing a physical quantity detection sensor according to claim 10, wherein the plurality of the different type substrates includes five substrates.

12. The method of manufacturing a physical quantity detection sensor according to claim 10, wherein the groove is formed in all substrates excluding one substrate among the sensor substrate and the plurality of the different type substrates.

13. A physical quantity detection sensor, comprising:
a sensor substrate including a sensor movable portion within a cavity; and
a different type substrate bonded on the sensor substrate, the different type substrate being formed of a different material from a material of the sensor substrate, wherein
the cavity is defined in part by sidewalls composed of the sensor substrate and a surface of the different type substrate joining the sidewalls, and
part of an outer edge of one of the sensor substrate and the different type substrate recedes further inwards than an outer edge of the other of the sensor substrate and the different type substrate.

14. The physical quantity detection sensor according to claim 13,
wherein the different type substrate comprises a first different type substrate bonded on an upper surface of the sensor substrate and a second different type substrate bonded on a lower surface of the sensor substrate, and
wherein part of an outer edge of the first different type substrate or the second different type substrate recedes further inwards than an outer edge of the sensor substrate.

15. The physical quantity detection sensor according to claim 13,
wherein the different type substrate comprises a first different type substrate bonded on an upper surface of the sensor substrate and a second different type substrate bonded on a lower surface of the sensor substrate, and
wherein part of outer edges of the first different type substrate and the second different type substrate recedes further inwards than an outer edge of the sensor substrate.

16. The physical quantity detection sensor according to claim 13,
wherein the different type substrate comprises a first different type substrate bonded on an upper surface of the sensor substrate and a second different type substrate bonded on a lower surface of the sensor substrate, and
wherein part of an outer edge of the sensor substrate recedes further inwards than outer edges of the first different type substrate and the second different type substrate.

17. The physical quantity detection sensor according to claim 13, wherein the sensor substrate has a bottom plate portion, and the sensor movable portion is sandwiched by the bottom plate portion and the different type substrate.

18. The physical quantity detection sensor according to claim 13, wherein the different type substrate comprises a plurality of different type substrates, and part of outer edges of a plurality of substrates among the sensor substrate and the plurality of the different type substrates recedes.

19. The physical quantity detection sensor according to claim 13, wherein the outer edge provided in a receding manner constitutes a slope.

\* \* \* \* \*